United States Patent [19]

Sun et al.

[11] Patent Number: 5,265,114
[45] Date of Patent: Nov. 23, 1993

[54] SYSTEM AND METHOD FOR SELECTIVELY LASER PROCESSING A TARGET STRUCTURE OF ONE OR MORE MATERIALS OF A MULTIMATERIAL, MULTILAYER DEVICE

[75] Inventors: Yunlong Sun; Craig D. Hutchens, both of Portland, Oreg.

[73] Assignee: Electro Scientific Industries, Inc., Portland, Oreg.

[21] Appl. No.: 943,875

[22] Filed: Sep. 10, 1992

[51] Int. Cl.⁵ .............................................. H01S 3/09
[52] U.S. Cl. ...................................... 372/69; 372/10; 372/25
[58] Field of Search .................. 372/69, 70, 71, 9, 10, 372/11, 25, 26

[56] References Cited

U.S. PATENT DOCUMENTS

| | | | |
|---|---|---|---|
| 4,656,635 | 4/1987 | Baer et al. | 372/9 |
| 4,731,795 | 3/1988 | Clark et al. | 372/71 |
| 4,930,901 | 6/1990 | Johnson et al. | 372/69 |
| 4,942,582 | 7/1990 | Kintz et al. | 372/9 |
| 4,965,803 | 10/1990 | Esterowitz et al. | 372/69 |
| 5,091,991 | 2/1992 | Tulip | 372/4 |

OTHER PUBLICATIONS

"Science Expands to Smaller Arena", Mike Francis, *Oregonian*, p. C7, (Oct. 27, 1991).
"Focused Ion Beams," John Orloff, *Scientific American*, pp. 96-101, (Oct. 1991).
"Computer-Simulated Explosion of Poly-Silicide Links in Programmable Redundancy for VLSI Memory Repair," J. D. Chlipala, L. M. Scarfone, and Chih-Yuan Lu, *IEEE Transactions on Electron Devices,* vol. 36, No. 11, pp. 2433-2439 (Nov. 1989).
"Computer Simulation of Target Link Explosion in Programmable Redundancy for Silicon Memory," L. M. Scarfone and J. D. Chlipala, Journal of Materials Research, vol. 1, No. 2, pp. 368-381, (Mar./Apr. 1986).
"Handbook of Laser Science and Technology," Marvin J. Weber, *Optical Materials*: Part II, CRC Press (1986).
*Applied Optics,* D. T. Gillespie, A. L. Olson, and L. W. Nichols, vol. IV, p. 1488 (1985).
"Explosion of Poly-Silicide Links in Laser Programmable Redundancy for VLSI Memory Repair," Chih-Yuan Lu, J. D. Chlipala, and L. M. Scarfone, *IEEE Transactions on Electron Devices,* vol. 36, No. 6, pp. 1056-1061 (Jun. 1989).

*Primary Examiner*—Georgia Y. Epps
*Attorney, Agent, or Firm*—Stoel Rives Boley Jones & Grey

[57] ABSTRACT

A laser system and processing method exploits the absorption contrast between the materials from which a link (12) and an underlying substrate (22) are made to effectively remove the link from the substrate. Laser output in a wavelength range of 1.2 to 2.0 μm (30) optimizes the absorption contrast between many high conductivity materials (e.g., metals) and silicon substrates and permits the use of laser output in a wider range of energy or power levels, pulse widths, without risking damage to the silicon substrates or adjacent circuit structures. Existing link processing laser systems can be readily modified to operate in the 1.2 to 3.0 μm range.

26 Claims, 3 Drawing Sheets

SYSTEM AND METHOD FOR SELECTIVELY LASER PROCESSING A TARGET STRUCTURE OF ONE OR MORE MATERIALS OF A MULTIMATERIAL, MULTILAYER DEVICE

TECHNICAL FIELD

The present invention relates to laser systems and methods for selectively processing a material of a single or multiple layer structure of a multimaterial, multilayer device and, in particular, to laser systems and processing methods that employ an output within a wavelength range that facilitates selective removal of an electrically conductive link structure on a silicon substrate of an integrated circuit.

BACKGROUND OF THE INVENTION

Conventional laser systems are typically employed for processing target structures such as electrically conductive semiconductor link structures in integrated circuits or memory devices such as EPROMs, DRAMs, and SRAMs. Link processing, which is presented herein only by way of example of selective material processing, may include total or partial removal, cutting, or vaporization of the link material. Examples of link processing laser systems include model Nos. 8000C and 9000 manufactured by Electro Scientific Industries, Inc., which is the assignee of the present invention. These systems utilize output wavelengths of 1.064 $\mu$m, 1.047 $\mu$m, and 0.532 $\mu$m.

The physics and computer modeling for laser-based link processing are described in "Computer Simulation of Target Link Explosion in Programmable Redundancy for Silicon Memory," L. M. Scarfone and J. D. Chlipala, *Journal of Materials Research*, Vol. 1, No. 2, March/April 1986, pp. 368-81, and "Explosion of Poly-Silicide Links in Laser-Programmable Redundancy for VLSI Memory Repair," Chin-Yuan Lu, J. D. Chlipale, and L. M. Scarfone, *IEEE Transactions on Electron Devices*, Vol. 36, No. 6, pp. 1056-1061 (June 1989).

FIGS. 1A and 1B depict a conventional output energy distribution of a laser output or pulse 10 directed at an integrated circuit or memory link structure 12, which can be positioned between link terminators 14, and is typically covered by a protective layer 16 often the result of oxide passivation. Link structure 12 may be composed of one or more layers of a single material or a composite "sandwich" of several materials including those required for anti-reflective coating, binding, or other manufacturing purposes. For example, link structure 12 may include sublayers of titanium and tungsten to enhance adhesion between aluminum base link material and a silicon substrate 22 which may include oxide layers.

With reference to FIGS. 1A and 1B, Chlipala et al. suggest that a laser pulse 10 focused to a spot 18 of radius R (which is, for example, about 2 $\mu$m) and applied across link structure 12 should have a suitable duration or pulse width and be of sufficient energy at a certain wavelength to cause a temperature distribution capable of cutting link structure 12. Since the spatial or critical dimensions of spot 18 are typically (but not always) larger than the width (which is, for example, about 1 $\mu$m) of link structure 12, a portion of laser pulse 10 impinges on silicon substrate 22. Laser pulse 10 must, therefore, be tailored not to have energy sufficient to damage silicon substrate 22 or adjacent circuit structures 20 either by direct laser energy absorption, by residual pulse energy coupled into substrate 22 below link structure 12 after it is vaporized, or by thermal conduction.

Yields of memory devices, for example, have been dramatically improved by combining the use of 1.064 or 1.047 $\mu$m laser output with the use of polysilicon and polycide link structures 12 to enable redundant memory cells. Even though it is a relatively poor electrical conductor, polysilicon-based material has been used to fabricate link structures 12 because it is more easily processed by laser systems generating a conventional laser output at a wavelength of 1.047 $\mu$m or 1.064 $\mu$m at energy levels that do not prohibitively damage silicon substrate 22. A laser output having well-controlled energy and power levels can generate across an entire polysilicon link structure 12 a desired temperature distribution that exceeds the melting temperature of polysilicon. Scarfone et al. attribute this advantage to the relatively large optical absorption depth of polysilicon at 1.064 $\mu$m in combination with other favorable parameters such as the mechanical strength, the thermal conductivity, and the melting and vaporization temperatures of polysilicon, protective layer 16, substrate 22, and other materials involved.

The technology trend is, however, toward developing more complex, higher density memories having more layers and smaller link structures and memory cell dimensions. As the complexity and numbers of layers of memory devices has increased, the polysilicon-like material has typically become more deeply buried and more difficult to process using a laser. Accordingly, an expensive and time consuming process is typically employed to delicately etch away surface layers to expose the polysilicon-like structures to be processed. Another disadvantage of polysilicon-like materials is that their electrical resistance increases with smaller dimensions, and thereby restricts the operating speed of the memory cells.

Because metals have higher conductivity and are typically deposited as a top conductive layer of memory devices, manufacturers would like to switch the material of link structures 12 to metals such as, for example, aluminum, titanium, nickel, copper, tungsten, platinum, gold, metal-nitrides (e.g., titanium nitride), or other electrically conductive metal-like materials in new generations of high-density, high-speed memory chips, whose storage capacity would exceed 4 and even 16 megabits.

Unfortunately, metals and other electrically conductive materials have much shorter optical absorption depths and smaller absorption coefficients at 1.047 $\mu$m or 1.064 $\mu$m than the absorption depth and absorption coefficient of polysilicon-like structures, causing most of the 1.047 $\mu$m or 1.064 $\mu$m laser output energy to be reflected away. Consequently, the small amount of laser output energy absorbed heats only the topmost portion or surface of a high conductivity link structure 12 such that most of the underlying volume of link structure 12 remains at a lower temperature. Thus, it is very difficult to cleanly process a high conductivity link structure 12 with the same laser output energy and power levels used to process polysilicon-like structures.

Simply increasing the laser output power level has deleterious effects on silicon substrate 22 and adjacent circuit structures 20. On the other hand, increasing the laser output pulse width, while maintaining the output power level, to allow sufficient time for thermal conduction to redistribute the heat to the underlying volume of a high conductivity link structure 12 increases the cumulative laser energy of an output pulse, thereby increasing the risk of damage to substrate 22 and circuit structure 20. Thus, some practitioners have concluded that laser systems are no longer the proper tool for processing high conductivity links and have discussed using ion beams instead ("Focused Ion Beams," Jon Orloff, *Scientific American*, October 1991, pp. 96-101). However, ion beam technology is still largely experimental for such applications, is very expensive, is not an automated production process, and cannot easily be retrofit into existing laser-based link cutting systems.

SUMMARY OF THE INVENTION

An object of the present invention is, therefore, to provide a laser system and method for cleanly processing link structures fabricated from various metallic or high conductivity materials without damaging underlying or surrounding substrate or adjacent circuit structures.

Another object of this invention is to provide such a system and method that employ selected laser output parameters to exploit the differential optical absorbance between high conductivity materials and silicon in order to reduce or eliminate damage sustained by the silicon substrate from residual laser output coupled into the silicon substrate after the link structure has been vaporized or processed.

Another object of this invention is to provide such a system and method that employ selected laser output parameters to exploit the differential optical absorbance between high conductivity materials and silicon in order to efficiently vaporize high conductivity link structures without affecting the silicon substrate or adjacent structures falling within the critical dimensions of an oversized spot of the laser output.

A further object of this invention is to provide such a system and method that utilize a larger processing window, i.e., accepts a greater variation in device construction and/or allows a greater variation in laser output power and energy levels, pulse widths, and pulse repetition frequencies to accurately process link structures.

Still another object of this invention is to provide such a system and method that can be relatively inexpensively retrofit into existing link processing laser systems.

The present invention exploits the differential absorption (also referred to as absorption contrast) between link material and the underlying substrate. The system and method of the present invention provide laser output (in a nonconventional range of wavelengths for link processing) that optimizes absorption contrast between, for example, silicon and high conductivity materials including metals, and results in relatively efficient link processing (cutting or vaporizing) without risk of damage to the surrounding and underlying substrate material. In particular, silicon has been shown to be only slightly affected by laser output of suitable power in the 1.2–3.0 $\mu$m range, but aluminum, nickel, tungsten, platinum, and gold, as well as other metals, absorb such laser output relatively well.

Conventional laser systems and methods for processing link structures 12 have emphasized the laser power absorption and temperature distribution properties of link structure 12, whereas the present invention considers the optical transmission/absorption properties of substrate 22 as well. Conventional laser systems function primarily to control the temperature distribution within spot 18 by preferring 1.047 $\mu$m or 1.064 $\mu$m laser wavelengths over the 0.532 $\mu$m laser wavelength and manipulating the shape, including duration and power, of pulse 10 to avoid overheating substrate 22 while obtaining the highest possible uniform temperature distribution across link structure 12. Because the present invention exploits the differential absorbance behavior of link structures 12 and substrate 22, the attention to pulse shaping can be relaxed and a pulse 10 of greater peak power and shorter duration can be used without risking damage to substrate 22.

Existing link processing laser systems can be relatively inexpensively modified to generate output in the 1.2 to 3.0 $\mu$m wavelength range. In addition, conventional laser devices that produce laser output within this wavelength range can be adapted for link processing. Available laser devices that produce output within this wavelength range are conventionally employed in fiber optic communications, medical applications, military range finding, and atmospheric pollution monitoring. Such laser systems have not, however, been used for general material processing because they are more complex and typically deliver laser output of significantly lower power or energy per pulse than, for example, a 1.064 $\mu$m Nd:YAG or a 10.6 $\mu$m $CO_2$ laser. The conventional wisdom in laser material processing, of maximizing laser output average or peak power with desired beam quality, reinforces the avoidance of using wavelengths that do not optimize output power. In contradistinction to the conventional wisdom, the present invention employs a laser output having a wavelength window that maximizes absorption contrast for selective material processing, even though the peak power of such laser output maybe lower than that which is conventionally available.

Additional objects and advantages of the invention will be apparent from the following detailed description of a preferred embodiment thereof which proceeds with reference to the accompanying drawings.

DETAILED DESCRIPTION OF PREFERRED EMBODIMENT

Figure 1A:
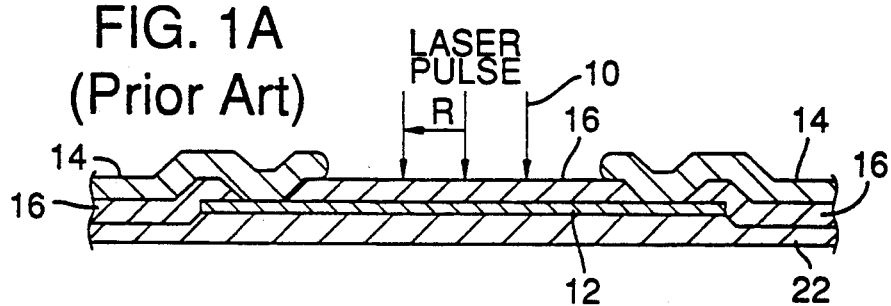
FIG. 1A is a fragmentary cross-sectional side view of a conventional semiconductor link structure receiving a laser pulse characterized by a particular energy distribution.
Figure 1B:
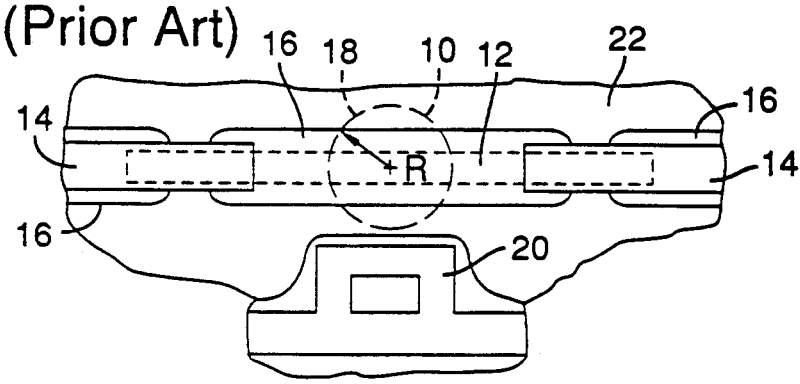
FIG. 1B is a fragmentary top view of the semiconductor link structure and the laser energy distribution of FIG. 1A, together with adjacent circuit structure.
Figure 2:
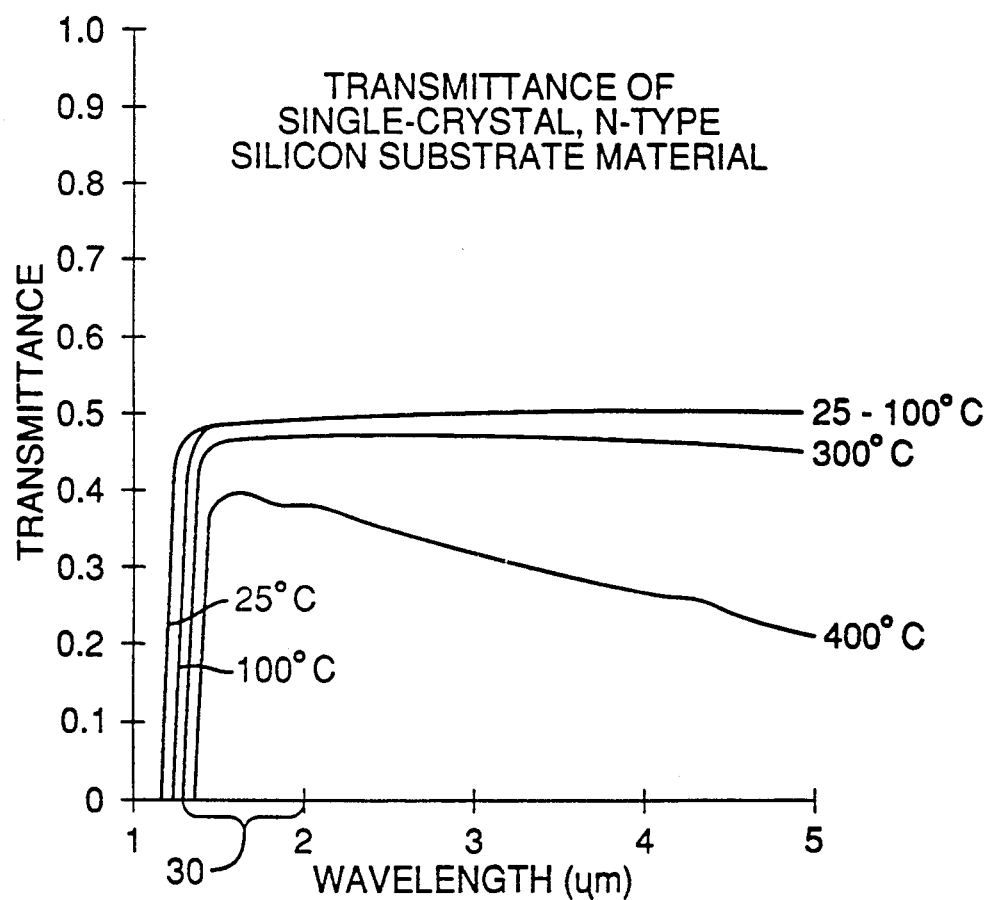
FIG. 2 shows graphical representations of optical transmission properties of silicon vs. wavelength for various silicon temperatures.
Figure 3:
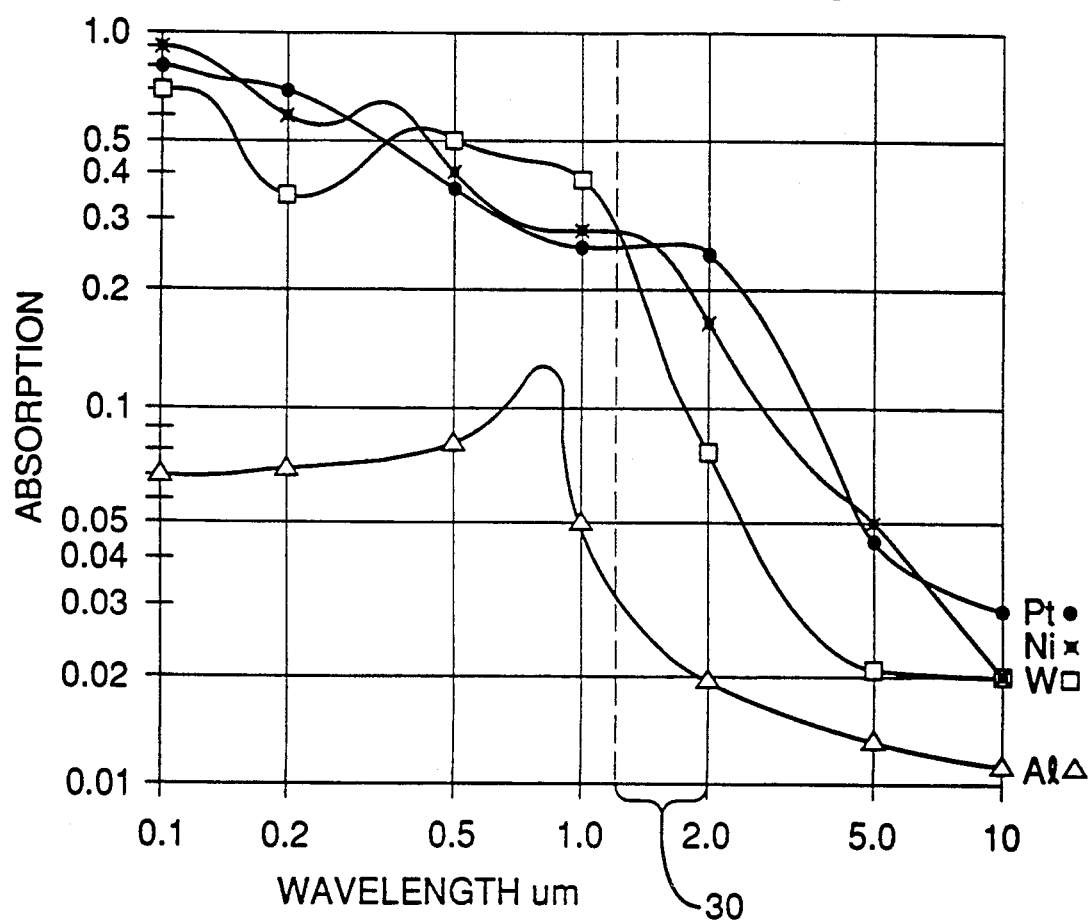
FIG. 3 shows graphical representations of the optical absorption properties of four different metals vs. wavelength.

FIGS. 2 and 3 graphically show the optical transmittance properties of silicon and optical absorbance properties of different metals such as aluminum, nickel, tungsten, and platinum that may be used in future link structures 12. FIG. 2 is an enlarged replication of a portion of FIG. 6e-52 from D. T. Gillespie, A. L. Olsen, and L. W. Nichols, *Appl. Opt.*, Vol. 4, p. 1488 (1965). FIG. 2 reveals that a 2.80 mm thick, single-crystal, N-type silicon will transmit nearly 50% of laser output directed at it in a wavelength range of about 1.12 to 4.5 μm when its temperature is between 25 and 300° C. The transmittance of this type of silicon sharply decreases as the wavelength output drops below 1.12 μm.

FIG. 3 is a compilation of the relevant portions of absorbance graphs found in the "Handbook of Laser Science and Technology," *Volume IV Optical Materials: Part 2 By Marvin J. Weber*, CRC press, (1986). FIG. 3 shows that metals, such as aluminum, nickel, tungsten, and platinum, absorb usable laser output from a wavelength range from below 0.1 μm to 3.0 μm, with aluminum not absorbing quite so much as the other metals. Metal nitrides (e.g., titanium nitride) and other high conductivity, metal-like materials used to form link structures 12 have generally similar optical absorption characteristics. However, the absorption coefficients for such materials are not as readily available as are those for metals.

The graphs in FIGS. 2 and 3 reveal a preferred overlap wavelength range 30 of about 1.2 μm to about 2 μm in which silicon is almost transparent and in which the optical absorption behavior of metal link materials is sufficient for them to be processed. When comparing the 1.2 to 2.0 μm wavelength range 30 to conventional laser wavelengths of 1.064 μm and 0.532 μm, skilled persons will note the optical transmittance of silicon substrate 22 increases by orders of magnitude while the optical absorption of high conductivity link structures 12 decreases by about a factor of two. The contrast between the absorbance, which is typically the inverse of transmittance, of silicon substrate 22 and high conductivity link structures 12 allows utilization of a higher peak power or energy laser pulse 10 to cut link structures 12 without a proportional increase in risk of damaging silicon substrate 22 or adjacent circuit structures 20.

Because shorter wavelengths within the 1.2 μm to 2.0 μm wavelength range 30 provide better laser beam focusability (and hence smaller laser output spots 18), and maximize the absorbance of high conductivity link structures 12, wavelengths such as 1.32 μm and 1.34 μm are preferred for most high conductivity link processing operations. Wavelengths such as 1.32 μm and 1.34 μm are sufficiently long to minimize damage to silicon substrate 22. The choice of 1.32 μm or 1.34 μm is also somewhat predicated on laser source availability and other complexities familiar to those skilled in the art.

In a preferred embodiment, a conventional diode-pumped, solid-state laser with a lasant crystal such as Nd:YAG, Nd:YLF, ND:YAP, or Nd:YVO4 is reconfigured to produce output in the 1.2 to 3.0 μm wavelength range. Each such redesigned laser employs resonator mirrors with appropriate dichroic coatings to be highly transmissive to the most conventional wavelength of the lasant crystal but have desired reflectivity at a selected wavelength within the range 1.2 μm to 3 μm and preferably at 1.32 μm or 1.34 μm. Such dichroic coatings would suppress laser action at the most conventional wavelength of the lasant crystal, such as 1.06 μm for Nd:YAG, and enhance laser action at the selected wavelength, preferably 1.32 μm for Nd:YAG.

In another preferred embodiment, a diode-pumped or arc lamp-pumped solid-state laser having a lasant crystal of YAG doped with other dopants such as holmium (laser output at 2.1 μm) or erbium (2.94 μm) could be employed to deliver laser output within the 1.2 μm to 3 μm wavelength range.

Preferably, all of the transmissive optics in a delivery path of the laser output beam are antireflection coated for the selected wavelength. In addition, laser output power or energy monitoring devices are changed, for example, from Si for 1.064 μm to Ge or GaAlAs for 1.32 μm or 1.34 μm, to be responsive to the selective wavelength. Other minor optical modifications to compensate for changes in laser output focusing length are preferred and known to those having skill in the art.

Figure 4:
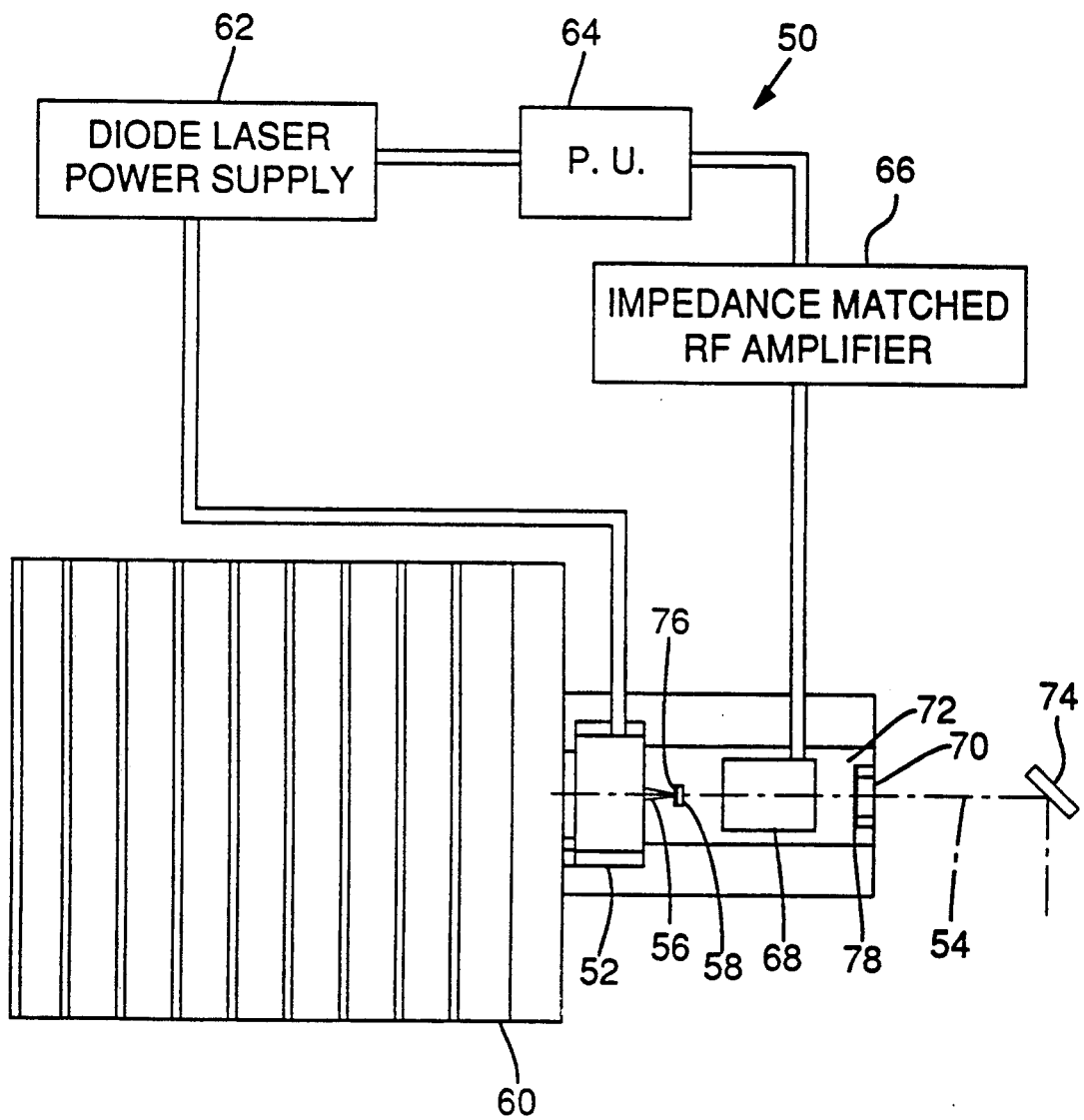
FIG. 4 is a plan view of a preferred embodiment of a laser system incorporating the present invention.

One skilled in the art will also recognize that higher output power diode lasers or pumping schemes, such as arc lamp-pumping, may be employed to compensate for the lower gain for lasers with lasant crystals such as Nd:YAG or Nd:YLF at 1.2 μm to 3.0 μm wavelengths. For example, with reference to an embodiment of a laser system 50 shown in FIG. 4, the output (preferably 3.0 watts or greater) of a high-power AlGaAs laser 52 may be funneled along optic axis 54 through a nonimaging concentrator 56 composed of a high refractive index, crystalline dielectric material and then coupled into an Nd:YLF lasant crystal 58. This method is disclosed in copending U.S. patent application No. 07/873,449 of Baird, DeFreez, and Sun, filed Apr. 24, 1992, for Method and Apparatus for Generating and Employing a High Density of Excited Ions in a Lasant, which is assigned to the assignee of the present invention.

Preferably, laser 52 is positioned against a heat sink 60 and is powered by a diode laser power supply 62 that is controlled by a processing unit 64. Processing unit 64 is also connected to an impedance-matched RF amplifier 66 and controls signals delivered to a transducer coupled to a Q-switch 68. Q-switch 68 is preferably positioned between lasant crystal 58 and an output coupler 70 within a resonator cavity 72. A targeting and focusing system 74 may be employed to direct laser output to a desired position on link structure 12 or other target material. Pumping, Q-switching, and targeting of the laser system 50 of the preferred embodiment are accomplished through conventional techniques well-known to persons skilled in the art.

An input mirror coating 76 on lasant crystal 58 and an output mirror coating 78 on output coupler 70 are preferably highly transmissive at the conventional 1.047 μm YLF emission wavelength. In addition, input mirror coating 76 is transmissive to the AlGaAs emission wavelength range and reflective at about 1.32 μm, and coating 78 is only partly transmissive at 1.32 μm to permit laser operation.

Skilled persons will appreciate that the significant change in the absorption contrast between high conductivity link structures 12 and the surrounding silicon substrate 22 will allow use of much higher processing powers than could be used with conventional 1.047 μm or 1.064 μm laser systems without causing damage to silicon substrate 22, i.e, the energy of laser output 10 in excess of that used to process high conductivity link structures 12 will not be absorbed by the underlying silicon substrate 22 during and after the high conductivity link structures 12 have been processed. The higher power laser output will allow a greater coupling of laser energy into high conductivity link structures 12 and therefore facilitate a more complete cutting of link structure 12.

Persons skilled in the art might expect that the level of hole-electron pairs created at the preferred high intensity light level would induce metal-like characteristics in silicon substrate 22, thereby adversely affecting the desired low absorption by silicon substrate 22. Experiments have shown, however, that at the laser power level used, the silicon substrate still retains its low absorption at 1.32 μm.

Higher power laser output may also raise the link structure material temperature more quickly and supply enough energy to exceed the required latent heat of vaporization of the link material, therefore resulting in direct vaporization of most or all of the link structure material. This direct vaporization is preferred since it will result in little chance of redeposition of the "removed" link structure material back onto the surrounding area of the substrate. On the other hand, if the laser power is not high enough due to laser system limitations or due to avoiding the risk of damaging the silicon substrate (as with some conventional link processing laser systems), then the direct vaporization rate of the link structure material would be much lower. Link structure material in the liquid state might then instead be splashed away and redeposited on the surrounding area of the silicon substrate 22 as a conductive "slag" which may cause malfunction of the integrated circuit device.

Preferably, high conductivity link structures 12 are processed in an oxygen-rich atmosphere to promote the oxidation of the liquid link material splashed away (i.e., the "slag") and the very small amount of remaining liquid link material in the original link position so that they become a non-conductive oxide, thereby further reducing the chance of the formation of a conductive bridge over the opened link or short circuit to another part of the integrated circuit, thus improving the yield of the laser processing system. Persons skilled in the art will appreciate that an oxygen concentration sufficient to generate non-conductive slag will vary with the nature of the material processed.

It will be obvious to those having skill in the art that many changes may be made to the details of the above-described embodiments of this invention without departing from the underlying principles thereof. Accordingly, it will be appreciated that this invention is also applicable to laser-based operations outside the semiconductor industry for selective removal of one or more materials from a multimaterial device. The scope of the present invention should be determined, therefore, only by the following claims.

We claim:

1. A method for selectively processing a multilayer, multimaterial device that includes a substrate and a high conductivity target structure having respective first and second wavelength sensitive light absorption characteristics, the first and second absorption characteristics having different light absorption properties that provide different light absorption contrasts for different wavelengths of light, comprising:
   generating at a predetermined wavelength a laser output having predetermined spatial dimensions; and
   directing the laser output to illuminate the target structure, the predetermined wavelength having a value that represents a sufficiently large absorption contrast between the target structure and the substrate to change a physical property of the target structure but leave substantially unchanged the physical property of the substrate within the spatial dimension of the laser output.

2. The method of claim 1 in which the target structure comprises metal and the substrate comprises silicon.

3. The method of claim 1 in which the wavelength of the laser output is in about the 1.2 μm to 3.0 μm range.

4. The method of claim 2 in which the wavelength of the laser output is in about the 1.2 μm to 3.0 μm range.

5. The method of claim 1 in which the target structure has a width that is smaller than the spatial dimension of the laser output.

6. The method of claim 2 in which the laser output is directed toward the target structure in an oxygen rich environment.

7. The method of claim 1 in which the target structure comprises multiple layers and the laser output comprises energy in excess of that which is required to process the target structure.

8. The method of claim 1 in which the laser output is generated by a Q-switched, diode-pumped, solid-state laser.

9. The method of claim 3 in which the target structure comprises a metal or combination of metals selected from the group of aluminum, titanium, nickel, copper, tungsten, platinum, gold, and the like.

10. A laser system for selectively processing a target structure of a multilayer, multimaterial device including a substrate, the target structure and substrate having wavelength sensitive properties, comprising:
    a pumping source; and
    a lasant positioned in a resonator cavity adapted to be pumped by the pumping source to provide a laser output having critical dimensions, power, and wavelength selected to exploit differences in the wavelength sensitive properties of the target structure and the substrate such that the target structure within the critical dimensions is effectively processed and the substrate within the critical dimensions is relatively undamaged by the laser output.

11. The laser system of claim 10 in which the target structure comprises metal and the substrate comprises silicon.

12. The laser system of claim 10 in which the wavelength of the laser output is in about the 1.2 μm to 3.0 μm range.

13. The laser system of claim 11 in which the wavelength of the laser output is in about the 1.2 μm to 3.0 μm range.

14. The laser system of claim 10 in which the target structure has a width that is smaller than the critical dimensions of the laser output.

15. The laser system of claim 11 in which the target structure is processed in an oxygen rich environment.

16. The method of claim 12 in which the target structure comprises multiple layers and the laser output comprises energy in excess of that which is required to process the target structure.

17. The laser system of claim 10 further comprising a Q-switched, diode-pumped or arc-lamp pumped, solid-state laser.

18. The laser system of claim 10 in which the lasant is selected from the group of Nd:YAG, Nd:YLF, Nd:YAP, and Nd:YVO$_4$, and in which the resonator cavity employs resonator mirrors that are highly transmissive to a conventional wavelength of the lasant but have desired reflectivity at a wavelength within a wavelength range of 1.2 to 3.0 μm.

19. The laser system of claim 10 in which the lasant comprises YAG doped with holmium or erbium and the resonator cavity is adapted to generate laser output at a wavelength within a wavelength range of 1.2 to 3.0 μm.

20. A method for employing a laser system to process high conductivity link structures forced on a silicon substrate, comprising:

generating laser output in a wavelength range of about 1.2 μm to 3.0 μm; and directing the laser output at a high conductivity link structure such that it is effectively processed but the substrate is relatively undamaged.

21. The method of claim 20 in which the high conductivity link structure has a width, and the laser output has a diameter that is larger than the width of the high conductivity link structure.

22. The method of claim 20 in which the high conductivity link structure comprises a metal or metal alloy.

23. The laser system of claim 22 in which the high conductivity link structure is processed in an oxygen rich environment.

24. The method of claim 20 in which the high conductivity link structure comprises multiple layers and the laser output comprises energy in excess of that which is required to process the high conductivity link structure.

25. A method for employing a laser system to process a highly conductive material of a target structure forced on a substrate; comprising:

positioning the target structure in an environment having an oxygen concentration;

generating a laser output having energy sufficient to process the material of the target structure; and directing the laser output to process the target material within the environment, wherein the oxygen concentration is sufficient to substantially convert any slag resulting from processing of the target structure to a substantially non-conductive oxide.

26. The method of claim 25 in which the target material comprises metal and the oxygen concentration is at least 50%.

* * * * *

UNITED STATES PATENT AND TRADEMARK OFFICE
CERTIFICATE OF CORRECTION

PATENT NO. : 5,265,114
DATED : November 23, 1993
INVENTOR(S) : Yunlong Sun and Craig D. Hutchens It is certified that error appears in the above-identified patent and that said Letters Patent is hereby corrected as shown below:

Column 1, line 38, change "Chin-Yuan" to --Chih-Yuan--.
Column 1, line 38, change "Chlipale" to --Chlipala--.
Column 5, line 9, change "press," to --Press--.
Claim 20, line 2, column 9, line 4, change "forced" to --formed--.
Claim 25, line 2, column 10, line 7, change "forced" to --formed--.

Signed and Sealed this

Thirty-first Day of May, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,265,114
DATED : November 23, 1993
INVENTOR(S) : Yunlong Sun and Craig D. Hutchens It is certified that error appears in the above-indentified patent and that said Letters Patent is hereby corrected as shown below:

Claim 16, line 1, column 8, line 53, change "method" to --laser system--.

Claim 23, line 1, column 9, line 19, change "laser system" to --method--.

Signed and Sealed this

First Day of April, 1997

Attest:

BRUCE LEHMAN

*Attesting Officer*  *Commissioner of Patents and Trademarks*

(12) REEXAMINATION CERTIFICATE (4419th)

United States Patent
Sun et al.

(10) Number: US 5,265,114 C1
(45) Certificate Issued: Aug. 21, 2001

(54) SYSTEM AND METHOD FOR SELECTIVELY LASER PROCESSING A TARGET STRUCTURE OF ONE OR MORE MATERIALS OF A MULTIMATERIAL, MULTILAYER DEVICE

(75) Inventors: Yunlong Sun; Craig D. Hutchens, both of Portland, OR (US)

(73) Assignee: Electro Scientific Industries, Inc., Portland, OR (US)

Reexamination Request:
No. 90/005,481, Sep. 7, 1999

Reexamination Certificate for:
Patent No.: 5,265,114
Issued: Nov. 23, 1993
Appl. No.: 07/943,875
Filed: Sep. 10, 1992

Certificate of Correction issued May 31, 1994.

Certificate of Correction issued Apr. 1, 1997.

(51) Int. Cl.$^7$ .............................. H01S 3/09; B23K 26/00; B23K 26/12
(52) U.S. Cl. ..................... 372/69; 219/121.69; 372/10; 372/25
(58) Field of Search .................... 219/121.69; 372/69

(56) References Cited

U.S. PATENT DOCUMENTS

| | | |
|---|---|---|
| 4,147,971 | 4/1979 | Price . |
| 4,179,310 | 12/1979 | Compton et al. . |
| 4,228,528 | 10/1980 | Cenker et al. . |
| 4,399,345 | 8/1983 | Lapham et al. . |
| 4,786,140 | 11/1988 | Melma et al. ............ 350/96.29 |
| 4,853,758 | 8/1989 | Fischer . |
| 4,901,330 * | 2/1990 | Wolfram et al. .............. 372/75 |
| 5,059,764 | 10/1991 | Baer ........................ 219/121.68 |
| 5,265,114 | 11/1993 | Sun et al. . |
| 5,569,398 | 10/1996 | Sun et al. ................. 219/121.68 |

OTHER PUBLICATIONS

CRC Handbook of Chemistry & Physics, 49th Edition, 1968–1969, p. E–102.

M. Faber, Jr., "Algorithmic Trimming on Active Circuitry", IEEE Trans. on Parts, Hybrids and Packaging, vol. PHP–10, 1974, pp. 248–254. (No month).

P. Cook et al., "Connections And Disconnections On Integrated Circuits Using Nanosecond Laser Pulses", Applied Physics Letters, vol. 26, No. 3, 1975, pp. 124–126. (No month).

J. C. North et al., "Laser Coding of Bipolar Read–Only Memories", IEEE Journal of Solid–State Circuits, vol. SC–11, No. 4, 1976, pp. 500–505. August.

J. Price, "A Passive Laser–Trimming Technique to Improve the Linearity of a 10–Bit D/A Converter", IEEE Journal of Solid–State Circuits, vol. SC–11, No. 6, 1976. Dec. pp. 789–794.

R. Cenker et al., "A Fault–Tolerant 64K Dynamic Random–Access Memory", IEEE Transactions on Electron Devices, vol. ED–26, No. 6, 1979, Jun., pp. 853–860.

B. Wells et al., "A Technique For Automatic Focusing And Alignment Of Monolithic Circuits For Laser Trimming", Proceedings of the Microelectronics Measurement Technology Seminar, 1981, Mar., pp. 1–30 to 1–43.

(List continued on next page.)

*Primary Examiner*—James Davie

(57) ABSTRACT

A laser system and processing method exploits the absorption contrast between the materials from which a link (12) and an underlying substrate (22) are made to effectively remove the link from the substrate. Laser output in a wavelength range of 1.2 to 2.0 μm (30) optimizes the absorption contrast between many high conductivity materials (e.g., metals) and silicon substrates and permits the use of laser output in a wider range of energy or power levels, pulse widths, without risking damage to the silicon substrates or adjacent circuit structures. Existing link processing laser systems can be readily modified to operate in the 1.2 to 3.0 μm range.

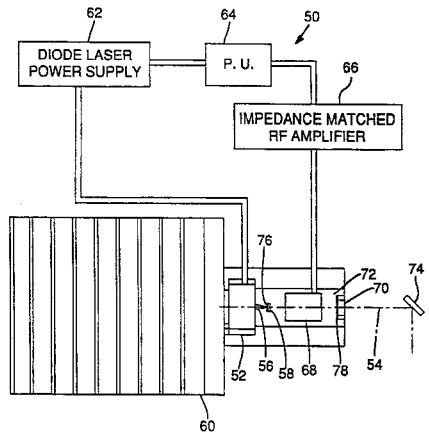

OTHER PUBLICATIONS

A. Litwin et al., "Laser Adjustment of Linear Monolithic Circuits", Laser Institute of America, vol. 38, ICALEO, 1983 (No month).

M. Linne et al., "Q–Switching of Diode–Pumped Solid–State Lasers", SPIE, vol. 898, Miniature Optics and Lasers, 1988 (No month).

* cited by examiner

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–9, 20–22 and 24–26 is confirmed.

Claims 10, 13, 15 and 23 are determined to be patentable as amended.

Claims 11, 12, 14 and 16–19, dependent on an amended claim, are determined to be patentable.

New claims 27–35 are added and determined to be patentable.

10. A laser system for selectively processing a *high conductivity* target structure of a multilayer, multimaterial device including a substrate, the *high conductivity* target structure and substrate having wavelength sensitive properties, comprising:

a pumping source; and a lasant positioned in a resonator cavity adapted to be pumped by the pumping source to provide a laser output having critical dimensions, power, and wavelength selected to exploit differences in the wavelength sensitive properties of the *high conductivity* target structure and the substrate such that the *high conductivity* target structure within the critical dimensions is effectively processed and the substrate within the critical dimensions is relatively undamaged by the laser output.

13. [The laser system of claim 11] *A laser system for selectively processing a target structure of a multilayer, multimaterial device including a substrate, the target structure and substrate having wavelength sensitive properties, comprising:*

*a pumping source; and*

*a lasant positioned in a resonator cavity adapted to be pumped by the pumping source to provide a laser output having critical dimensions, power, and wavelength selected to exploit differences in the wavelength sensitive properties of the target structure and the substrate such that the target structure within the critical dimensions is effectively processed and the substrate within the critical dimensions is relatively undamaged by the laser output, in which the target structure comprises metal and the substrate comprises silicon, and* in which the wavelength of the laser output is in about the 1.2 $\mu$m to 3.0 $\mu$m range.

15. [The laser system of claim 11] *A laser system for selectively processing a target structure of a multilayer, multimaterial device including a substrate, the target structure and substrate having wavelength sensitive properties, comprising:*

*a pumping source; and*

*a lasant positioned in a resonator cavity adapted to be pumped by the pumping source to provide a laser output having critical dimensions, power, and wavelength selected to exploit differences in the wavelength sensitive properties of the target structure and the substrate such that the target structure within the critical dimensions is effectively processed and the substrate within the critical dimensions is relatively undamaged by the laser output, in which the target structure comprises metal and the substrate comprises silicon, and* in which the target structure is processed in an oyxgen rich environment.

23. [The method of claim 22 in which] *A method for employing a laser system to process high conductivity link structures formed on a silicon substrate, comprising:*

*generating laser output in a wavelength range of about 1.2 $\mu$m to 3.0 $\mu$m; and*

*directing the laser output at a high conductivity link structure such that it is effectively processed but the substrate is relatively undamaged, wherein the high conductivity link structure comprises a metal or metal alloy, and wherein* the high conductivity link structure is processed in an oxygen rich environment.

*27. A laser system producing a laser output for removing a high-conductivity link structure of a multilayer, multimaterial device including an adjacent circuit structure and a substrate, said laser system comprising*

*a) a pumping source; and*

*b) a lasant positioned in a resonator cavity adapted to be pumped by the pumping source to provide said laser output, said laser output having a spot size, power, and wavelength selected to exploit differences in the wavelength sensitive properties of the high conductivity link structure and the substrate such that the high conductivity link structure within the spot size is effectively removed and the substrate within the spot size is relatively undamaged by the laser output, and wherein said adjacent circuit structure is undamaged.*

*28. A laser system according to claim 27, wherein said high conductivity link structure has a width that is smaller than said spot size.*

*29. A laser system according to claim 28 in which the high conductivity target structure comprises metal and the substrate comprises silicon.*

*30. A laser system according to claim 29, wherein said wavelength of the laser output is in about the 1.2 $\mu$m to 3.0 $\mu$m range.*

*31. A laser system according to claim 27 in which the high conductivity target structure comprises metal and the substrate comprises silicon.*

*32. A laser system according to claim 31, wherein said wavelength of the laser output is in about the 1.2 $\mu$m to 3.0 $\mu$m range.*

*33. A laser system according to claim 27 which further comprises a Q-switching mechanism and wherein said pumping source comprises a diode pumping source.*

*34. A laser system according to claim 33 in which the lasant is selected from the group of Nd:YAG, Nd:YLF, Nd:YAP, and Nd:YVO$_4$, and wherein said wavelength of the laser output is in about the 1.2 $\mu$m to 3.0 $\mu$m range.*

*35. A laser system according to claim 27 in which the lasant is selected from the group of Nd:YAG, Nd:YLF, Nd:YAP, and Nd:YVO$_4$, and wherein said wavelength of the laser output is in about the 1.2 $\mu$m to 3.0 $\mu$m range.*

* * * * *